United States Patent
Shirai (10) Patent No.: US 7,236,372 B2
(45) Date of Patent: Jun. 26, 2007

(54) SURFACE MOUNTED POWER SUPPLY CIRCUIT APPARATUS AND METHOD FOR MANUFACTURING IT

(75) Inventor: Michihiro Shirai, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 349 days.

(21) Appl. No.: 10/838,318

(22) Filed: May 5, 2004

(65) Prior Publication Data

US 2004/0227156 A1 Nov. 18, 2004

(30) Foreign Application Priority Data

May 12, 2003 (JP) ............... 2003-132532

(51) Int. Cl.
*H05K 7/00* (2006.01)

(52) U.S. Cl. .............. 361/760; 361/763; 361/782; 361/807; 361/808; 361/811; 174/262; 174/260; 174/255

(58) Field of Classification Search ........ 361/760, 361/763, 782, 807; 257/199

See application file for complete search history.

(56) References Cited

U.S. PATENT DOCUMENTS

| | | | | |
|---|---|---|---|---|
| 5,986,894 A * | 11/1999 | Lint et al. | ............. | 361/813 |
| 6,005,463 A * | 12/1999 | Lint et al. | ............. | 336/65 |
| 6,040,739 A * | 3/2000 | Wedeen et al. | ............. | 330/66 |
| 6,125,041 A * | 9/2000 | Yoshikawa et al. | ............. | 361/737 |
| 6,272,020 B1* | 8/2001 | Tosaki et al. | ............. | 361/763 |
| 6,285,559 B1* | 9/2001 | Fukiharu | ............. | 361/760 |
| 6,301,122 B1* | 10/2001 | Ishikawa et al. | ............. | 361/794 |
| 6,366,468 B1* | 4/2002 | Pan | ............. | 361/761 |
| 6,376,769 B1* | 4/2002 | Chung | ............. | 174/524 |
| 6,625,036 B1* | 9/2003 | Horio | ............. | 361/760 |
| 6,633,005 B2* | 10/2003 | Ichitsubo et al. | ............. | 174/260 |
| 6,822,875 B2* | 11/2004 | Chan et al. | ............. | 361/760 |
| 6,825,744 B2* | 11/2004 | Harney | ............. | 335/78 |
| 6,876,555 B2* | 4/2005 | Matsumoto et al. | ............. | 361/782 |
| 2002/0048160 A1* | 4/2002 | Tsuchiya et al. | ............. | 361/823 |
| 2003/0081393 A1* | 5/2003 | Yokoyama | ............. | 361/767 |

* cited by examiner

*Primary Examiner*—Tuan Dinh
*Assistant Examiner*—Hoa C. Nguyen
(74) *Attorney, Agent, or Firm*—Browdy and Neimark, PLLC (57) ABSTRACT

A surface mounted power supply circuit apparatus, including a circuit substrate, circuit constituting parts mounted on the circuit substrate, and a sealing member provided on the circuit substrate for covering the circuit constituting parts, at least one portion of the circuit constituting parts being configured to be contained in a containing portion formed in the circuit substrate.

8 Claims, 8 Drawing Sheets

SURFACE MOUNTED POWER SUPPLY CIRCUIT APPARATUS AND METHOD FOR MANUFACTURING IT

BACKGROUND OF THE INVENTION

1. Field of the Invention

The present invention relates to a surface mounted power supply circuit apparatus which is used for printers and electronics and especially including a DC-DC converter, and a method for manufacturing it.

2. Description of Related Art

A plurality of DC power supplies are used for electronics such as personal computers, mobile phones, or printers. For example, a 24V and 5V power supply is required for a printer, and a power supply circuit including a DC—DC converter is often used. The power supply circuit is generally composed of electronic parts such as a wire-wound inductor, a condenser, a diode and a so-called pressure raising IC or the like, and these electronic parts are often mounted on upper and lower surfaces of a circuit substrate.

Recently, a great number of small and thinned electronics have been used and therefore it is under avoidable circumstance that a power supply circuit used for such thinned electronics is thinned.

However, conventionally, in the power supply circuit including the DC—DC converter, especially, a proposal for thinning positively the circuit has not been carried out. A proposal for enabling the power supply circuit to surface-mount on the circuit substrate by improving a cost performance in manufacturing an assembly in which the power supply circuit is mounted on the circuit substrate has also not been accomplished.

Moreover, it is requested strongly that electronic parts manufactured in the future can be surface-mounted on a mother board which is an applied product to which the electronic parts are attached, in order to promote rationalization of manufacturing.

SUMMARY OF THE INVENTION

Therefore, an object of the present invention is to provide a surface mounted power supply circuit apparatus and a method for manufacturing it, which solve the aforementioned problems of the prior art, and are capable of accomplishing a thinned type thereof, improving cost performance significantly and enabling surface-mounting.

To attain the above object, an aspect of the present invention is a surface mounted power supply circuit apparatus comprising a circuit substrate, circuit constituting parts mounted on the circuit substrate, and a sealing member provided on the circuit substrate for covering the circuit constituting parts. At least one portion of the circuit constituting parts is configured to be contained in a containing portion formed in the circuit substrate.

Another aspect of the present invention is a method for manufacturing the surface mounted power supply circuit apparatus, comprising the steps of preparing a collecting circuit substrate having a plurality of cutting possible lines arranged in directions of X and Y which are perpendicular to each other, and configured to form a plurality of circuit substrate units when the collecting circuit substrate is cut at the cutting possible lines, forming a containing portion comprising a hole or concave portion for containing at least one portion of circuit constituting parts, mounting the circuit constituting parts on each of the plurality of circuit substrate units and containing the one portion of the circuit constituting parts in the containing portion, providing a sealing member on the collecting circuit substrate to cover the circuit constituting parts, and cutting the collecting circuit substrate along the cutting possible lines to form a plurality of surface mounted power supply circuit apparatuses.

DETAILED DESCRIPTION OF THE PREFERRED EMBODIMENTS

Embodiments of a surface mounted power supply circuit apparatus and a method for manufacturing it, according to the present invention, will be explained with reference to the accompanying drawings.

Figure 1:
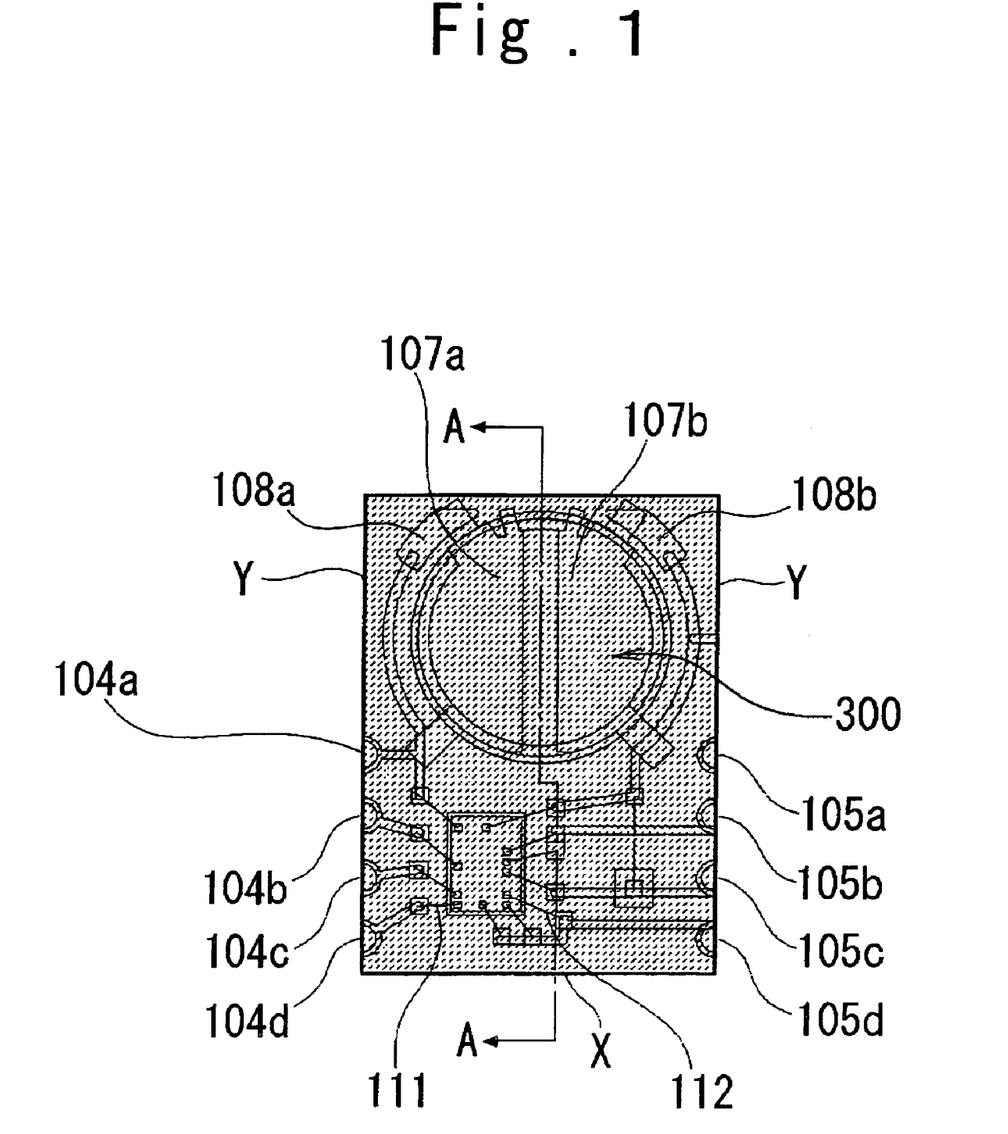
FIG. 1 is a top view showing a surface mounted power supply circuit apparatus according to the present invention.
Figure 2:
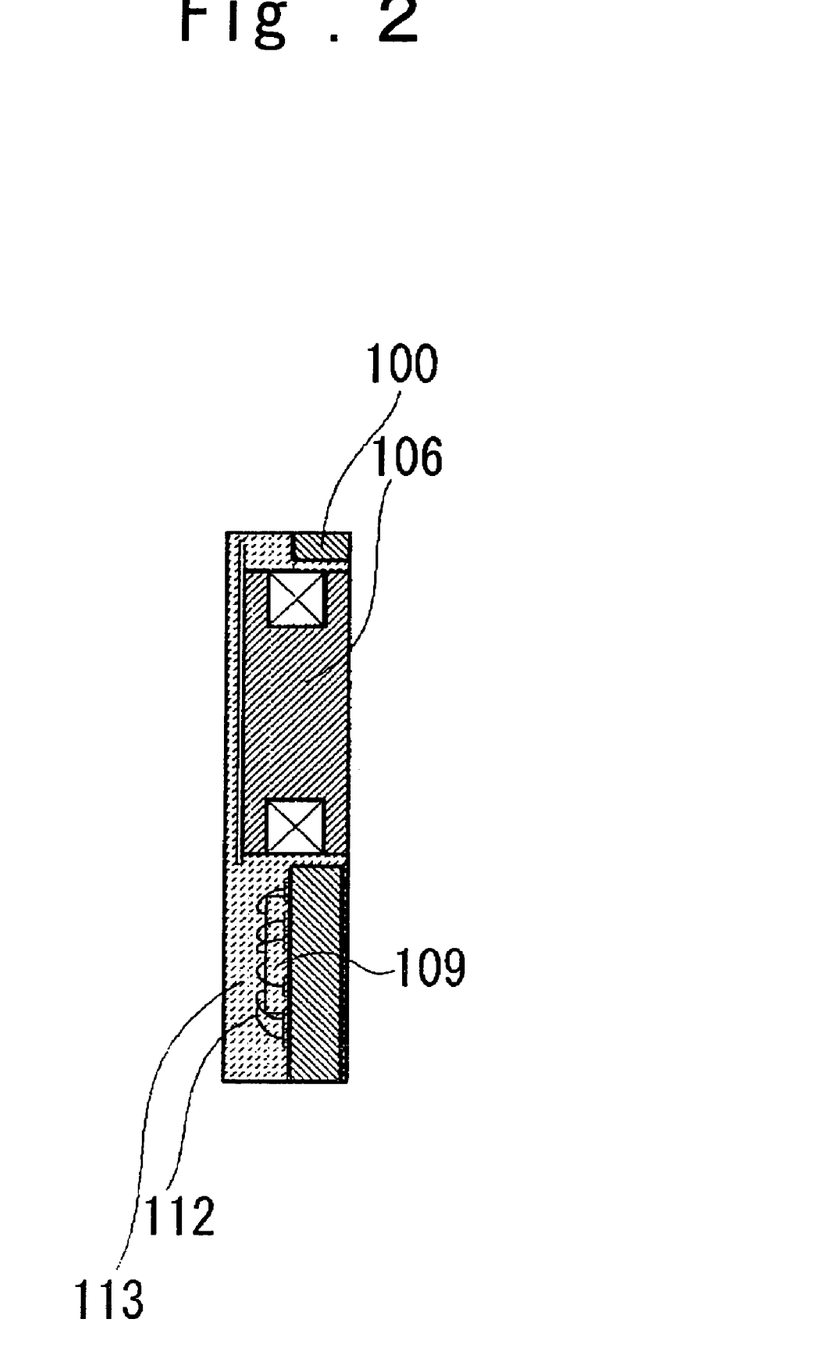
FIG. 2 is a sectional view taken along A—A line in FIG. 1.
Figure 3:
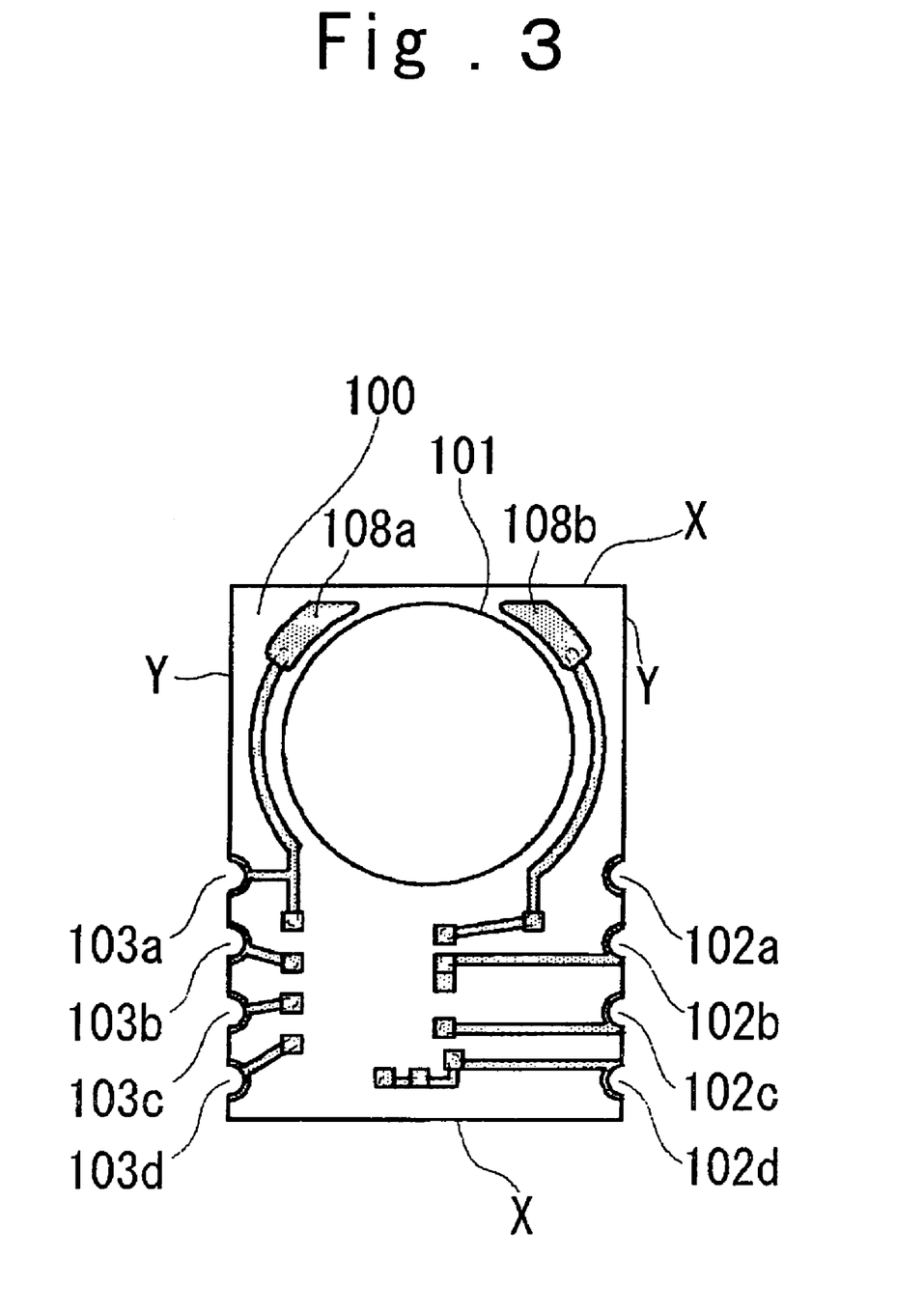
FIG. 3 is a top view showing a circuit substrate in the surface mounted power supply circuit apparatus as shown in FIG. 1.
Figure 4:
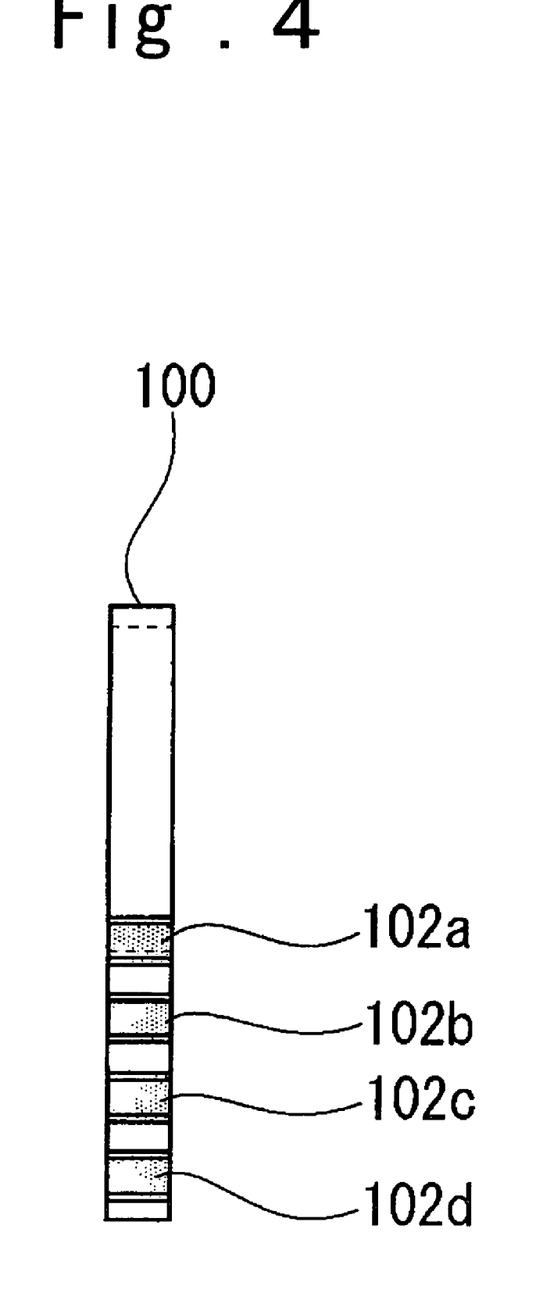
FIG. 4 is a right side view of the circuit substrate as shown in FIG. 3.
Figure 5:
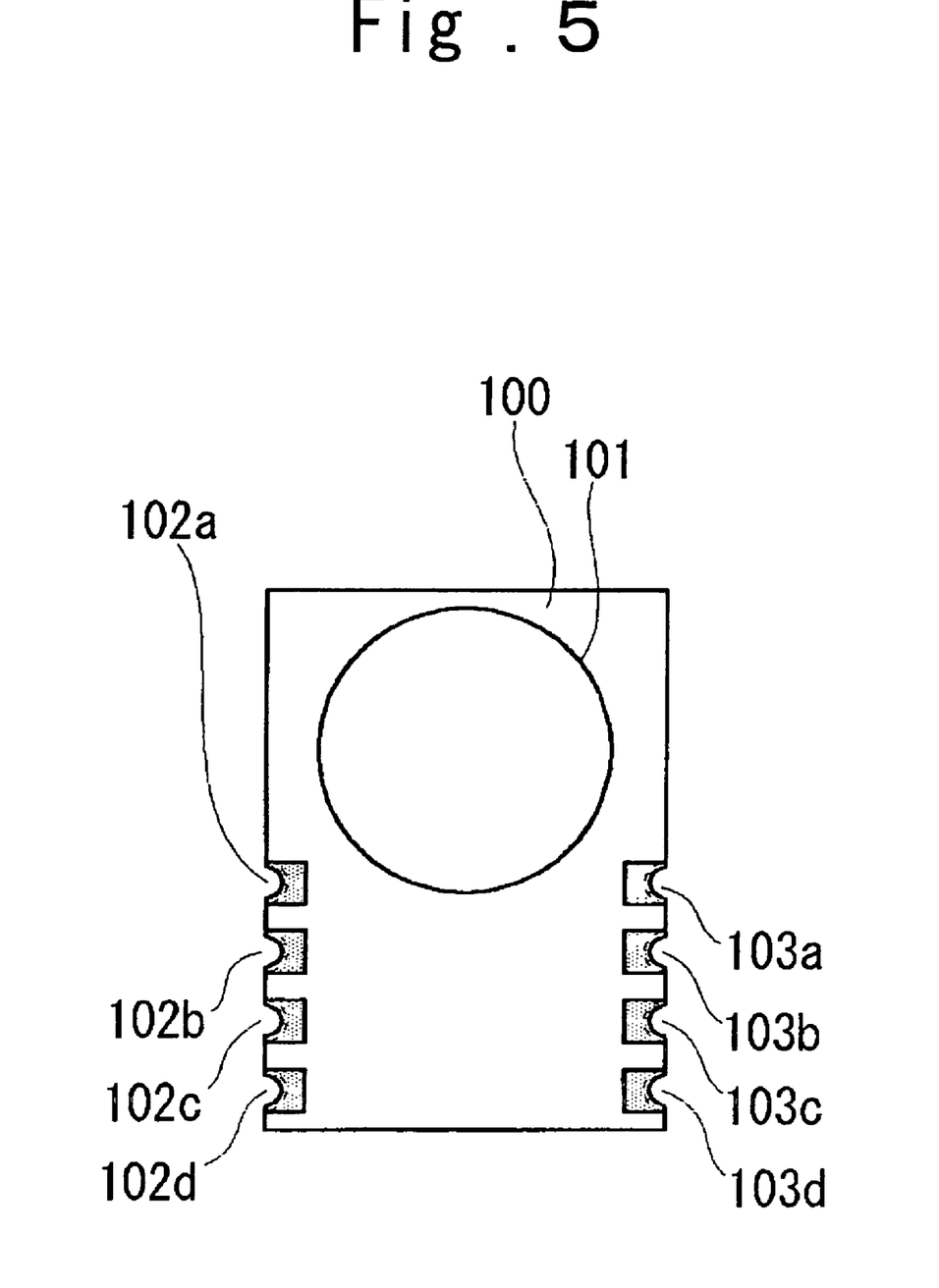
FIG. 5 is a bottom view of the circuit substrate as shown in FIG. 3.

FIGS. 1 and 2 illustrate one embodiment of the surface mounted power supply circuit apparatus of the present invention. The surface mounted power supply circuit apparatus comprises a circuit substrate 100 as shown in FIGS. 3 to 5, a plurality of circuit constituting parts 300 which are surface-mounted on the circuit substrate 100, and a sealing member 113 provided on the circuit substrate 100 to cover the circuit constituting parts 300.

The circuit substrate 100 comprises a rectangular plate having a relative thin thickness as shown in FIGS. 1 to 5. The circuit substrate 100 has a size of about 5 by 7 mm$^2$ in one example. The circuit constituting parts 300 include for example, an inductor 106, and a pressure rising IC 109. The circuit constituting parts 300 may include a diode 110 (see FIG. 8), when needed. In addition, the circuit constituting parts 300 are not limited to the structure as described above, and may be composed of various parts.

Surface-mounted on the circuit substrate 100 is a connecting circuit section connectable between the circuit constituting parts 300 and connectable the circuit constituting parts 300 with an outside electric circuit section (not shown). The connecting circuit section includes upper and lower surface electrodes 102a, 102b, 102c, 102d and 103a, 103b, 103c and 103d, as shown in FIGS. 3 and 5, inductor terminals 107a and 107b, connecting terminals 108a and 108b for the inductor terminals 107a and 107b, connecting wires 111 and 112 for the upper surface electrodes, and so on, as shown in FIG. 1.

The circuit substrate 100 is provided at an upper and central portion thereof with a containing portion 101 disposed to contain at least one portion of the circuit constituting parts 300, and at lower and opposite side edges thereof with a plurality of through holes 104a, 104b, 104c, 104*d* and 105*a*, 105*b*, 105*c*, 105*d*. The upper and lower surface electrodes 102*a*, 102*b*, 102*c*, 102*d* and 103*a*, 103*b*, 103*c*, 103*d* are provided on the through holes 104*a*, 104*b*, 104*c*, 104*d* and 105*a*, 105*b*, 105*c*, 105*d*, respectively, and configured to be connected electrically through the through holes with respect to each other. The lower surface electrodes of the circuit substrate 100 are configured to be surface-mounted on the outside electric circuit section, for example, a mother board (not shown) of an applied product, for example, by means of soldering or the like.

The containing portion 101 comprises, for example, a hole or concave portion formed in the circuit substrate 100. The one portion of the circuit constituting parts is contained in the containing portion 101. In this case, it should be noted that the part having the largest thickness of the circuit constituting parts, for example, the inductor 106 is preferably contained in the containing portion. This is because a height from projected the circuit substrate 100 can be possibly limited if the part having the largest thickness is contained in the containing portion, and as a result, a thinned surface mounted power supply circuit apparatus is provided. Accordingly, a plurality of containing portions may be formed in the circuit substrate 100, without limiting to the one containing portion 101 as shown in the aforementioned embodiment, in a scope that there are not strength obstacle of the circuit substrate and affection on a mounting space of the circuit constituting parts and so on.

The surface mounted power supply circuit apparatus according to the present invention as described above may include at least one DC—DC converter (not shown).

The sealing member 113 is made of any resin material, for example, sealing parts other than the circuit substrate such as the upper and lower surface electrodes and connecting circuit section and so on, is preferable in that deterioration of electric performance of the parts is prevented.

Figure 7:
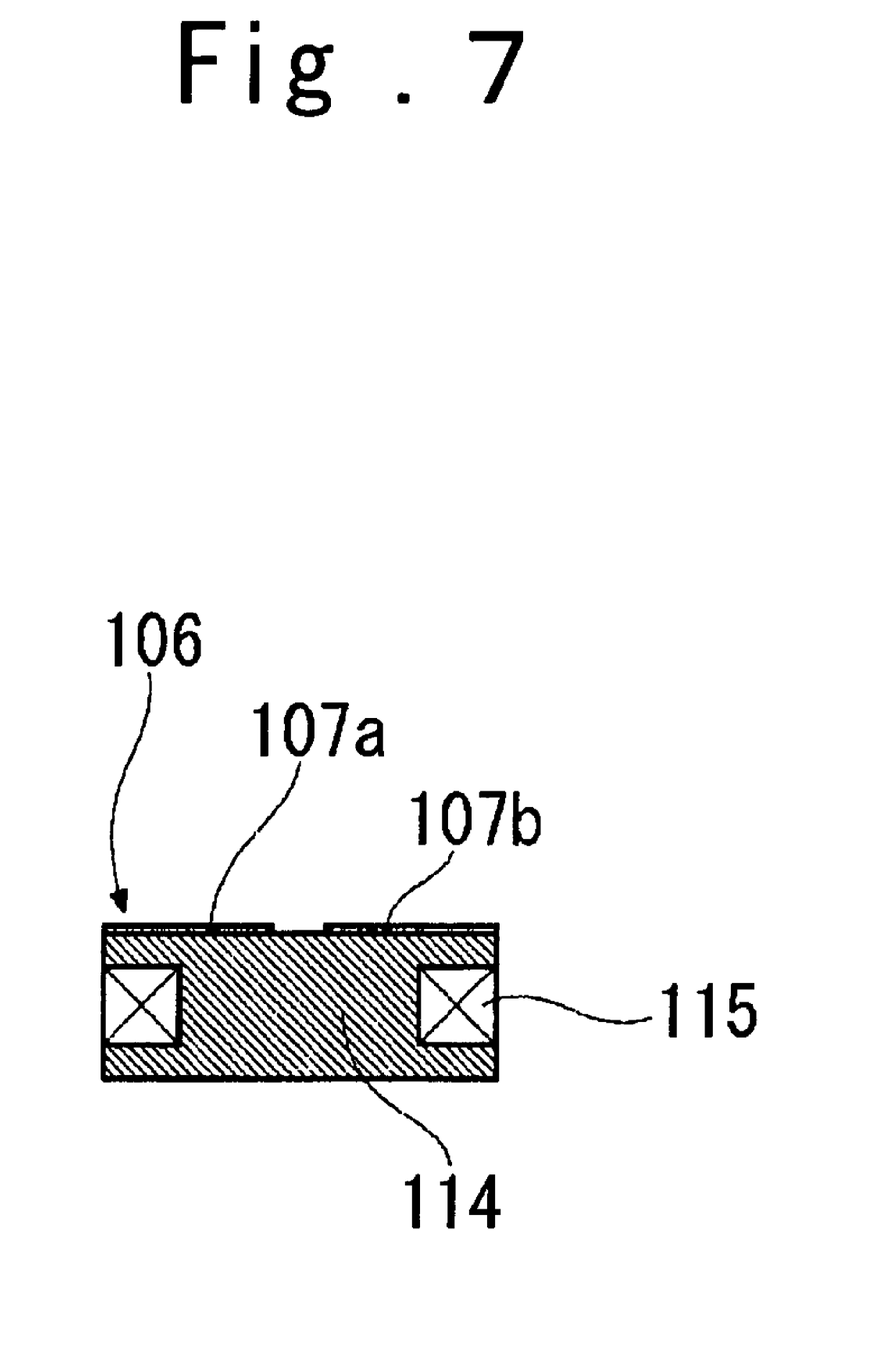
FIG. 7 is a structural explanatory view of an inductor of circuit constituting parts in the surface mounted power supply circuit apparatus as shown in FIG. 1.

FIG. 7 illustrates a section of the inductor 106 which has a ferrite core 114 and a coil 115 wound about the ferrite core 114. Disposed on an upper surface of the ferrite core 114 are inductor terminals 107*a* and 107*b* with which terminals of the coil 115 are connected by soldering or the like.

The inductor 106 of the larger thickness is contained in the containing portion 101 of the circuit substrate 100 and the inductor terminals 107*a*, 107*b* of the inductor 106 and the connecting terminals 108*a*, 108*b* on the circuit substrate 100 are connected, respectively, by soldering or the like.

The pressure raising IC 109 and so on are mounted on the circuit substrate 100 in accordance with a necessary circuit structure, and are electrically connected through wire bonds 111 and 112 with the upper and lower surface electrodes 102*a*, 102*b*, 102*c*, 102*d* and 103*a*, 103*b*, 103*c*, 103*d* conducted by the through hole 104*a*, 104*b*, 104*c*, 104*d*, and 105*a*, 105*b*, 105*c*, 105*d*. The connected circuit constituting parts, in other words, the inductor 106, the pressure raising IC 109 and so on, and the connecting circuit section and so on, are then sealed by means of the sealing member 113.

In an embodiment, a thickness of the surface mounted power supply circuit apparatus according to the present invention was 1.5 mm, including the sealing member 113. Finally, the power supply circuit apparatus is mounted on the mother board by connecting the lower surface electrodes with the mother board.

Figure 8:
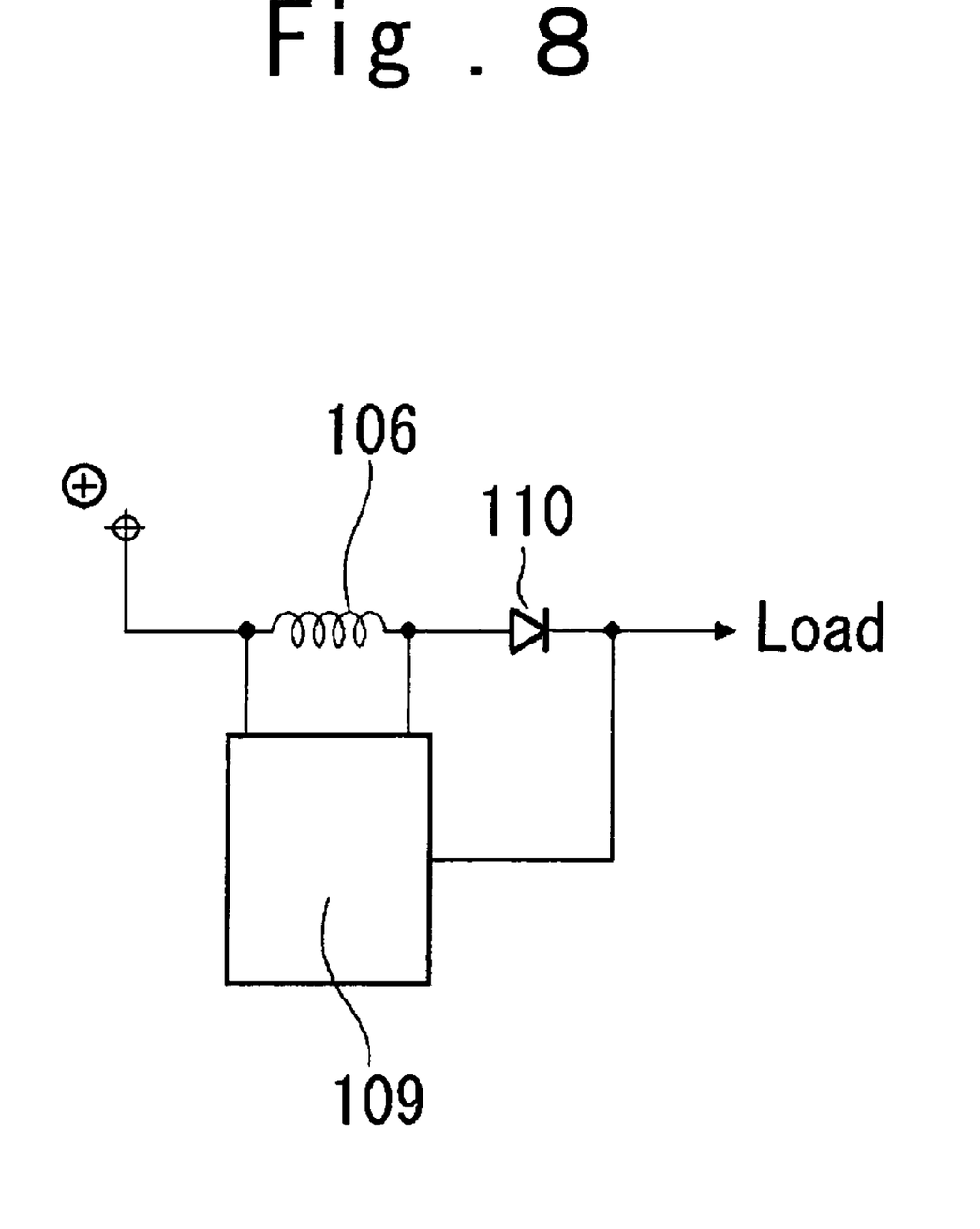
FIG. 8 is a circuit view of the inductor in FIG. 7.

FIG. 8 illustrates a circuit of the inductor 106. As shown in FIG. 8, the inductor 106 is connected in parallel with the pressure raising IC 109, and is connected in series with the diode 110. A detailed description for function of the circuit is omitted, while, a plurality of voltage supplies a DC to a DC can be performed by separating and raising the pressure.

The power supply circuit of the present invention can be applied to any circuit, in which basic parts, for example, if the pressure raising IC, the inductor, a condenser and so on, are included, regardless of variation in the circuit structure.

Next, a method for manufacturing the surface mounted power supply circuit apparatus of the present invention will be explained.

Figure 6:
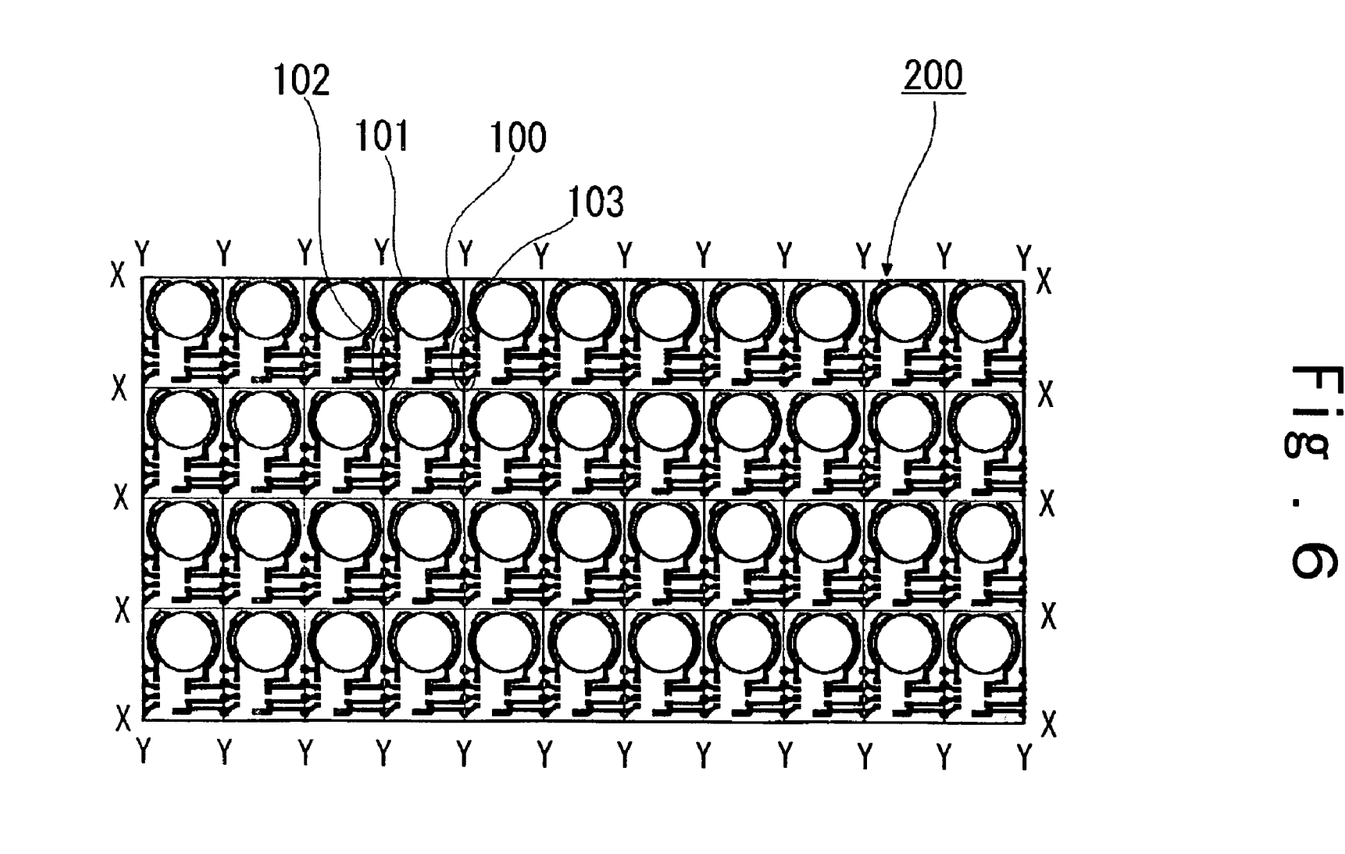
FIG. 6 is a plan view of a collecting circuit substrate structured to manufacture a plurality of surface mounted power supply circuit apparatus at the same time.

FIG. 6 illustrates an embodiment for manufacturing a plurality of surface mounted power supply circuit apparatuses at the same time.

The manufacturing method first comprises a step of preparing a rectangular collecting circuit substrate 200 having a large size, as shown in FIG. 6. The collecting circuit substrate 200 is formed with a plurality of cutting possible lines arranged in directions of X and Y which are perpendicular to each other. More specifically, a plurality of cutting possible lines Y are set to extend upward and downward with constant spaces laterally of the collecting circuit substrate, in FIG. 6, and a plurality of cutting possible lines X are set to be perpendicular with the cutting possible lines Y and to extend laterally with constant spaces upward and downward of the collecting circuit substrate. A plurality of circuit substrate units are formed, when the collecting circuit substrate is cut at the cutting possible lines X and Y which are perpendicular mutually. The circuit substrate units correspond to the aforementioned circuit substrate 100. Meanwhile, the collecting circuit substrate 200 is cut by means of any cutting means, for example, a press.

Next, a containing portion 101 comprising a hole or concave portion and containing at least one portion of the circuit constituting parts is formed in each of the circuit substrate units.

Next, the plurality of circuit constituting parts, that is, the inductor 106 and the pressure raising IC 109 and so on are mounted on each of the plurality of circuit substrate units 100, and at least one of the circuit constituting parts, the inductor 106 is contained in the containing portion 101, as described above. At this time, the connecting circuit part including the inductor terminals 107*a* and 107*b* and so on, is mounted on each of the plurality of circuit substrate units, in other words, the circuit substrate 100.

Next the sealing member 113 is provided on the collecting circuit substrate 200 to cover the circuit constituting parts and the connecting circuit part.

Subsequently, the collecting circuit substrate is cut along the cutting possible lines to form the plurality of surface mounted power supply circuit apparatuses.

According to the present invention, it is possible to provide a small and thinned surface mounted power supply circuit apparatus in which surface mounting is reliably possible, especially, to realize a power supply circuit apparatus including a DC—DC converter, which has a superior cost performance.

The surface mounted power supply circuit apparatus of the present invention also can be flexibly corresponded to a design of a circuit for using common circuit constituting parts, that is, the inductor, the pressure raising IC, the condenser and so on.

Furthermore, according to the manufacturing method of the present invention, a great number of power supply circuit apparatuses which can be surface-mounted on the mother board which is an applied product, can be manufactured from the collecting circuit substrate at the same time, it is possible to very contribute to minimization and thinning of the applied product and reduction of cost thereof, as a result, a practical advantageous effect thereof is superior.

Although the preferred embodiments of the present invention have been described, the present invention is not limited to these embodiments, it should be noted that various modifications or changes can be made to the embodiments.

What is claimed is:

1. A surface mounted power supply circuit apparatus, comprising:
   a circuit substrate having two sides;
   a circuit constituting parts mounted on said circuit substrate; and
   a sealing member provided on said circuit substrate for covering said circuit constituting parts,
   at least one portion of said circuit constituting parts being configured to be contained in a containing portion formed in said circuit substrate
   wherein said circuit substrate includes a connecting circuit section that allows connection between said circuit constituting parts and that allows connection to an external electric circuit section, and
   wherein said connecting circuit section has upper electrodes provided on an upper surface of said circuit substrate and lower electrodes provided on a lower surface of said circuit substrate, and said upper and lower electrodes are connected via through holes formed along both sides of said circuit substrate.

2. The surface mounted power supply circuit apparatus according to claim 1, further comprising at least one DC-DC converter.

3. The surface mounted power supply circuit apparatus according to claim 1,
   wherein said containing portion comprises a concave portion.

4. The surface mounted power supply circuit apparatus according to claim 1,
   wherein said containing portion comprises a hole.

5. The surface mounted power supply circuit apparatus according to claim 1,
   wherein said circuit constituting parts include an inductor, and a voltage control IC.

6. The surface mounted power supply circuit apparatus according to claim 1, wherein said external electric circuit section comprises a mother board.

7. The surface mounted power supply circuit apparatus according to claim 1,
   wherein said connecting circuit section is provided in a position remote from said circuit constituting parts.

8. A method for manufacturing the surface mounted power supply circuit apparatus in according to claim 1, comprising the steps of: preparing a collecting circuit substrate having a plurality of cutting possible lines arranged in directions of X and Y which are perpendicular to each other, and configured to form a plurality of circuit substrate units when the collecting circuit substrate is cut at the cutting possible lines; forming a containing portion comprising a hole or concave portion on each of the plurality of circuit substrates containing at least one portion of circuit constituting parts; surface mounting the circuit constituting parts on each of the plurality of circuit substrate units and containing the one portion of the circuit constituting parts in the containing portion; providing a sealing member on the collecting circuit substrate to cover the circuit constituting parts; and cutting the collecting circuit substrate along the cutting possible lines to form a plurality of surface mounted power supply circuit apparatuses.

\* \* \* \* \*